United States Patent
Ahn et al.

(10) Patent No.: US 6,893,984 B2
(45) Date of Patent: May 17, 2005

(54) EVAPORATED LAAlO$_3$ FILMS FOR GATE DIELECTRICS

(75) Inventors: Kiey Y. Ahn, Chappaqua, NY (US); Leonard Forbes, Corvallis, OR (US)

(73) Assignee: Micron Technology Inc., Boise, ID (US)

( * ) Notice: Subject to any disclaimer, the term of this patent is extended or adjusted under 35 U.S.C. 154(b) by 318 days.

(21) Appl. No.: 10/081,439

(22) Filed: Feb. 20, 2002

(65) Prior Publication Data
US 2003/0157764 A1 Aug. 21, 2003

(51) Int. Cl.$^7$ .............................................. H01L 21/31
(52) U.S. Cl. ...................................... 438/785; 438/287
(58) Field of Search ........................................ 438/785

(56) References Cited

U.S. PATENT DOCUMENTS

| | | | |
|---|---|---|---|
| 4,394,673 A | 7/1983 | Thompson et al. | 357/15 |
| 5,302,461 A | 4/1994 | Anthony | 428/472 |
| 5,625,233 A | 4/1997 | Cabral, Jr. et al. | 257/771 |
| 5,698,022 A | 12/1997 | Glassman et al. | |
| 5,801,105 A | 9/1998 | Yano et al. | 438/785 |
| 5,810,923 A | 9/1998 | Yano et al. | 117/84 |

(Continued)

FOREIGN PATENT DOCUMENTS

| | | | |
|---|---|---|---|
| EP | 1096042 | 5/2001 | C30B/25/02 |
| WO | WO 02/31875 | 4/2002 | H01L/21/316 |

OTHER PUBLICATIONS

Geller, S., et al., "Crystallographic Studies of Perovskite-like Compounds. II. Rare Earth Aluminates", *Acta Cryst.* vol. 9, (1956), pp. 1019–1025.

Giess, E.A., et al., "Lanthanide gallate perovskite–type substrates for epitaxial, high–T$_c$ superconducting Ba$_2$YCu$_3$O$_{7-\delta}$ films", *IBM J. Res. Develop.* vol. 34, No. 6, (Nov. 6, 1990), pp. 916–926.

Lee, A.E., et al., "Epitaxially grown sputtered LaAlO$_3$ films", *Appl. Phys. Lett.* 57 (19), (Nov. 5, 1990), pp. 2019–2021.

Molodyk, A. A., et al., "Volatile Surfactant–Assisted MOCVD: Application to LaAlO$_3$ Thin Film Growth", *Chem. Vap. Deposition* vol. 6, No. 3, (2000), pp. 133–138.

Park, Byung–Eun, et al., "Electrical properties of LaAlO$_3$/Si and Sr$_{0.8}$Bi$_{2.2}$Ta$_2$O$_9$/LaAlO$_3$/Si structures", *Applied Physics Letters*, vol. 79, No. 6, (Aug. 6, 2001), pp. 806–808.

(Continued)

*Primary Examiner*—Douglas Wille
(74) *Attorney, Agent, or Firm*—Schwegman, Lundberg, Woessner & Kluth, P.A.

(57) ABSTRACT

A gate dielectric containing LaAlO$_3$ and method of fabricating a gate dielectric contained LaAlO$_3$ produce a reliable gate dielectric having a thinner equivalent oxide thickness than attainable using SiO$_2$. The LaAlO$_3$ gate dielectrics formed are thermodynamically stable such that these gate dielectrics will have minimal reactions with a silicon substrate or other structures during processing. A LaAlO$_3$ gate dielectric is formed by evaporating Al$_2$O$_3$ at a given rate, evaporating La$_2$O$_3$ at another rate, and controlling the two rates to provide an amorphous film containing LaAlO$_3$ on a transistor body region. The evaporation deposition of the LaAlO$_3$ film is performed using two electron guns to evaporate dry pellets of Al$_2$O$_3$ and La$_2$O$_3$. The two rates for evaporating the materials are selectively chosen to provide a dielectric film composition having a predetermined dielectric constant ranging from the dielectric constant of an Al$_2$O$_3$ film to the dielectric constant of a La$_2$O$_3$ film. In addition to forming a LaAlO$_3$ gate dielectric for a transistor, memory devices, and information handling devices such as computers include elements having a LaAlO$_3$ gate electric with a thin equivalent oxide thickness.

43 Claims, 4 Drawing Sheets

U.S. PATENT DOCUMENTS

| | | | | |
|---|---|---|---|---|
| 5,828,080 | A | 10/1998 | Yano et al. | 257/43 |
| 5,840,897 | A | 11/1998 | Kirlin et al. | 546/2 |
| 6,040,243 | A | 3/2000 | Li et al. | 438/687 |
| 6,057,271 | A | 5/2000 | Kenjiro et al. | 505/475 |
| 6,093,944 | A | 7/2000 | VanDover | 257/310 |
| 6,110,529 | A | 8/2000 | Gardiner et al. | 427/250 |
| 6,203,613 | B1 | 3/2001 | Gates et al. | 117/104 |
| 6,203,726 | B1 * | 3/2001 | Danielson et al. | 252/301.4 R |
| 6,207,589 | B1 | 3/2001 | Ma et al. | 438/785 |
| 6,297,539 | B1 | 10/2001 | Ma et al. | 257/410 |
| 6,300,203 | B1 | 10/2001 | Buynoski et al. | 438/287 |
| 6,387,712 | B1 | 5/2002 | Yano et al. | 438/3 |
| 6,432,779 | B1 | 8/2002 | Hobbs et al. | 438/287 |
| 6,451,662 | B1 | 9/2002 | Chudzik et al. | 438/386 |
| 6,461,914 | B1 | 10/2002 | Roberts et al. | 438/253 |
| 6,465,334 | B1 | 10/2002 | Buynoski et al. | 438/591 |
| 6,495,436 | B2 | 12/2002 | Ahn et al. | 438/591 |
| 6,514,828 | B2 | 2/2003 | Ahn et al. | 438/297 |
| 6,521,911 | B2 | 2/2003 | Parsons et al. | 257/52 |
| 6,527,866 | B1 * | 3/2003 | Matijasevic et al. | 118/719 |
| 6,531,354 | B2 | 3/2003 | Maria et al. | 438/216 |
| 6,534,420 | B2 | 3/2003 | Ahn et al. | 438/768 |
| 6,620,670 | B2 | 9/2003 | Song et al. | 438/216 |
| 6,627,503 | B2 | 9/2003 | Ma et al. | 438/287 |
| 6,645,882 | B1 * | 11/2003 | Halliyal et al. | 438/785 |
| 6,683,011 | B2 | 1/2004 | Smith et al. | 438/785 |
| 6,696,332 | B2 | 2/2004 | Visokay et al. | 438/216 |
| 6,699,745 | B1 | 3/2004 | Banerjee et al. | 438/258 |
| 2002/0089023 | A1 | 7/2002 | Yu et al. | 257/411 |
| 2002/0146916 | A1 | 10/2002 | Irino et al. | 438/785 |
| 2002/0155688 | A1 | 10/2002 | Ahn et al. | 438/592 |
| 2002/0155689 | A1 | 10/2002 | Ahn et al. | 29/76 |
| 2002/0192974 | A1 | 12/2002 | Ahn et al. | 438/722 |
| 2003/0017717 | A1 | 1/2003 | Ahn et al. | 438/768 |
| 2003/0119291 | A1 | 6/2003 | Ahn et al. | |
| 2003/0207593 | A1 | 11/2003 | Derderian et al. | 438/778 |

OTHER PUBLICATIONS

Takemoto, J.H., et al., "Microstrip Resonators and Filters Using High–TC Superconducting Thin Films on LaAlO$_3$", *IEEE Transactions on Magnetics*, vol. 27, No. 2, (Mar., 1991), pp. 2549–2552.

Wilk, G.D., et al., "High–κ gate dielectrics: Current status and materials properties considerations", *J. Appl. Phys.*, vol. 89, No. 10, (May 15, 2001), pp. 5243–5275.

Ohmi, S., et al., "Rare Earth Metal Oxides for High–K Gate Insulator", Electrochemical Society Proceedings, vol. 2002-2, (2002), 376–387.

Lee, L.P., et al., "Monolithic 77 K dc SQUID magnetometer", *Appl. Phys. Lett.* 59 (23), (Dec. 2, 1991), pp. 3051–3053.

Bunshad, Rointan F., et al., "Deposition Technologies for Films and Coatings: Developments and Applications", *Park Ridge, N.J., U.S.A. : Noyes Publications*, (1992), 102–103.

Kim, D., et al., "Atomic Control of Substrate Termination and Heteroepitaxial Growth of SrTiO3/LaAlO3 Films", *Journal of the Korean Phyical Society, 36(6)*, (Jun. 2000), 444–448.

Wolf, S., et al., *In:Silicon Processing of the VLSI Era vol. 1*, Lattic Press, 374–380.

* cited by examiner

EVAPORATED LAAlO₃ FILMS FOR GATE DIELECTRICS

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, the body region 132 defining a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate dielectric 140. The mainstay for forming the gate dielectric has been silicon dioxide, $SiO_2$. Thermally grown amorphous $SiO_2$ provides a electrically and thermodynamically stable material, where the interface of a $SiO_2$ layer with an underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but with increased scaling, other requirements for gate dielectrics create the need to find other dielectric materials to be used for a gate dielectric.

A gate dielectric 140, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations. A $SiO_2$ layer of thickness, t, deposited on a Si surface as a gate dielectric will also have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness, $t_{eq}$, to under 10 Å, the physical thickness requirement for a $SiO_2$ layer used for a gate dielectric would be need to be approximately 4 to 7 Å. Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7–8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of $SiO_2$, $\kappa_{ox}$=3.9, associated with $t_{eq}$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than $SiO_2$.

The thinner equivalent oxide thickness, $t_{eq}$, required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed. Thus, if a $SiO_2$ layer is formed in the process, the $t_{eq}$ is again limited by a $SiO_2$ layer. In the event, that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

What is needed is an alternate dielectric material for forming a gate dielectric that has a high dielectric constant relative to $SiO_2$, and is thermodynamically stable with respect to silicon such that forming the dielectric on a silicon layer will not result in $SiO_2$ formation, or diffusion of material, such as dopants, into the gate dielectric from the underlying silicon layer.

SUMMARY OF THE INVENTION

A solution to the problems as discussed above is addressed in the present invention. In accordance with the present invention, a method of forming a gate dielectric on a transistor body region includes evaporating $Al_2O_3$ at a given rate, evaporating $La_2O_3$ at another rate, and controlling the first rate and the second rate to provide an amorphous film containing $LaAlO_3$ on the transistor body region. The evaporation deposition of the $LaAlO_3$ film is performed using two electron guns to evaporate dry pellets of $Al_2O_3$ and $La_2O_3$. The two rates for evaporating the materials are selectively chosen to provide a dielectric film composition having a predetermined dielectric constant ranging from the dielectric constant of an $Al_2O_3$ film to the dielectric constant of a $La_2O_3$ film.

A transistor is fabricated by forming two source/drain regions separated by a body region, evaporating $Al_2O_3$ using an electron gun at one rate, evaporating $La_2O_3$ using a second electron gun at a second rate, controlling the two evaporation rates to provide a film containing $LaAlO_3$ on the body region, and forming a conductive gate on the film containing $LaAlO_3$. Dry pellets of $Al_2O_3$ and $La_2O_3$ are used for evaporating $Al_2O_3$ and $La_2O_3$. Controlling the two rates provides the capability to form a film composition having a predetermined dielectric constant.

Advantageously, these methods can be used to further form a memory array where the process of forming the memory is adapted to form the gate dielectric in accordance with the present invention. Additionally, an information handling system can be formed using the methods of the present invention, wherein a memory array formed in conjunction with forming a processor is formed to include transistors having gate dielectrics containing $LaAlO_3$. These gate dielectrics are formed by evaporating $Al_2O_3$ using an electron gun at one rate, evaporating $La_2O_3$ using a second electron gun at a second rate, and controlling the two evaporation rates to provide a film containing $LaAlO_3$ for use as the gate dielectric.

In accordance with the present invention, a transistor having two source/drain regions separated by a body region includes an amorphous gate dielectric containing $LaAlO_3$ located above the body region between the two source/drain regions. The gate dielectric may be essentially composed of $LaAlO_3$ or it may also contain $Al_2O_3$, and $La_2O_3$. Depending on its composition, the dielectric constant of the gate dielectric can range from about 9 to about 30. Depending on its composition, the gate dielectric can have a thickness corresponding to an equivalent oxide thickness ($t_{eq}$) in the range from about 1.5 Angstroms to about 5 Angstroms, in addition to larger $t_{eq}$ values.

Advantageously, a memory array includes a number of transistors having two source/drain regions separated by a body region with an amorphous gate dielectric containing $LaAlO_3$ located above the body region between the two source/drain regions. These transistors provide the memory array with an array of transistors having gate dielectrics with equivalent oxide thickness ($t_{eq}$) in the range from about 1.5 Angstroms to about 5 Angstroms, providing transistors operable at reduced voltage levels. Additionally, an information handling device, such as a computer, includes a processor and a memory array having a number of transistors having two source/drain regions separated by a body region that includes an amorphous gate dielectric containing $LaAlO_3$ located above the body region between the two source/drain regions.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
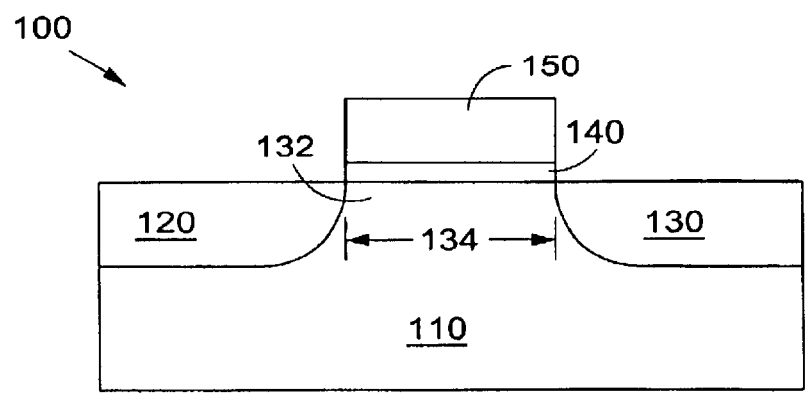
FIG. 1 depicts a common configuration of a transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In a recent article by G. D. Wilk et al., *Journal of Applied Physics*, vol. 89: no. 10, pp. 5243–5275 (2001), material properties of high dielectric materials for gate dielectrics were discussed. Among the information disclosed was the viability of $Al_2O_3$ as a substitute for $SiO_2$. $Al_2O_3$ was disclosed has having favourable properties for use as a gate dielectric such as high band gap, thermodynamic stability on Si up to high temperatures, and an amorphous structure. In addition, Wilk disclosed that forming a layer of $Al_2O_3$ on silicon does not result in a $SiO_2$ interfacial layer. However, the dielectric constant of $Al_2O_3$ is only 9, where thin layers may have a dielectric constant of about 8 to about 10. Though the dielectric constant of $Al_2O_3$ is in an improvement over $SiO_2$, a higher dielectric constant for a gate dielectric is desirable. Other dielectrics and their properties discussed by Wilk include

| Material | Dielectric Constant ($\kappa$) | Band gap $E_g$ (eV) | Crystal Structure(s) |
|---|---|---|---|
| $SiO_2$ | 3.9 | 8.9 | Amorphous |
| $Si_3N_4$ | 7 | 5.1 | Amorphous |
| $Al_2O_3$ | 9 | 8.7 | Amorphous |
| $Y_2O_3$ | 15 | 5.6 | Cubic |
| $La_2O_3$ | 30 | 4.3 | Hexagonal, Cubic |
| $Ta_2O_5$ | 26 | 4.5 | Orthorhombic |
| $TiO_2$ | 80 | 3.5 | Tetrag. (rutile, anatase) |

-continued

| Material | Dielectric Constant ($\kappa$) | Band gap $E_g$ (eV) | Crystal Structure(s) |
|---|---|---|---|
| $HfO_2$ | 25 | 5.7 | Mono., Tetrag., Cubic |
| $ZrO_2$ | 25 | 7.8 | Mono., Tetrag., Cubic |

One of the advantages using $SiO_2$ as a gate dielectric has been that the formation of the $SiO_2$ layer results is an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. The abovementioned material properties including structure are for the materials in a bulk form. The materials having the advantage of a high dielectric constants relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Reportedly, a physical thickness of about 21 Å of $Al_2O_3$, grown by thermal oxidation following thermal evaporation of an Al layer, could be obtained providing a $t_{eq}$ of 9.6 Å with an interface state density greater than or equal to $3 \times 10^{10}$ $eV^{-1}$ $cm^{-2}$. Higher physical thicknesses of about 48 Å of $Al_2O_3$ provided films with $t_{eq}$ of 21 Å with leakage current of approximately $10^{-8}$ $A/cm^2$ at 1 V gate bias, which is good when compared to a leakage current of $10^{-1}$ $A/cm^2$ at 1 V gate bias for a physical thickness of 21 Å for a pure $SiO_2$ layer.

Another abovementioned material, $La_2O_3$, reportedly provided good results when fabricating thin films on silicon. A physical thickness of 33 Å was obtained for a layer of $La_2O_3$, grown by thermal oxidation following thermal evaporation of a La layer, providing a $t_{eq}$ of 4.8 Å, a leakage current of $10^{-1}$ $A/cm^2$ at 1 V gate bias, and an interface state density of approximately $3 \times 10^{10}$ $eV^{-1}$ $cm^2$. Other studies on $La_2O_3$ showed reduced leakage current but an interfacial $SiO_x$ layer.

Though both $Al_2O_3$ and $La_2O_3$ demonstrated good qualities as a substitute for $SiO_2$, better dielectrics are needed. In a recent article by B. Park et al., *Applied Physics Letters*, vol. 79: no. 6, pp. 806–808 (2001), use of $LaAlO_3$ on silicon as a buffer layer between the silicon surface and a ferroelectric film was reported. A $LaAlO_3$ film was deposited on a silicon substrate by heating single crystal pellets of $LaAlO_3$ using an electron gun with the substrate maintained at room temperature. The $LaAlO_3$ film was annealed ex situ in an electric furnace at 700° C. for 10 minutes in $N_2$ ambience. Films having thickness from 18 nm to 80 nm were grown. The resultant films were determined to have a leakage current density decreased by about three orders of magnitude after annealing. This reported experimentation providing a $LaAlO_3$ buffer layer between silicon and a ferroelectric film demonstrated that a $LaAlO_3$ film could be obtained on silicon providing an amorphous dielectric layer with a dielectric constant between 21 and 24. Other reports indicate that $LaAlO_3$ film can be grown by metal-organic chemical-vapor-deposition method, pulsed-laser depositions method, and rf magnetron sputtering method.

In accordance with the present invention, layers of $LaAlO_3$ can be deposited on silicon using low cost starting materials and resulting in dielectric layers whose dielectric constant can be chosen to range from the dielectric constant of $Al_2O_3$ to the dielectric constant of $La_2O_3$. Advantageously, a layer of $LaAlO_3$ is grown using dry pellets of $Al_2O_3$ and $La_2O_3$. The gate dielectric is formed on a silicon substrate or silicon layer by electron beam evaporation of the dry pellets of using two electron guns controlled by two rate monitors. Controlling the rates for evaporating the dry pellets $Al_2O_3$ and $La_2O_3$ allows for the formation of a gate dielectric having a composition with a predetermined dielectric constant. The predetermined dielectric constant will range from the dielectric constant of $Al_2O_3$ to the dielectric constant of $La_2O_3$, depending on the composition of the film. The composition of the film can be shifted more towards an $Al_2O_3$ film or more towards a $La_2O_3$ film, depending upon the choice of the dielectric constant.

Figure 2:
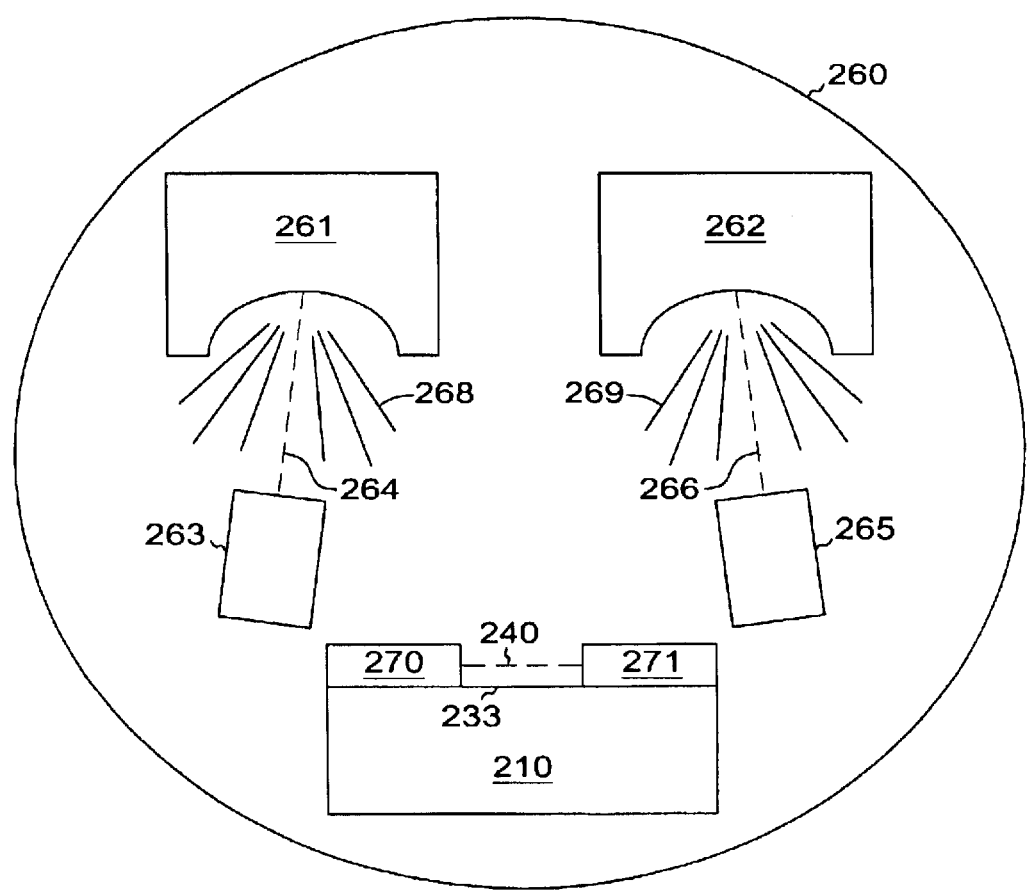
FIG. 2 depicts a deposition process in accordance with the present invention.

FIG. 2 depicts an electron beam evaporation technique to deposit a material forming a film containing $LaAlO_3$ on a surface such as a body region of a transistor. In FIG. 2, a substrate 210 is placed inside a deposition chamber 260. The substrate in this embodiment is masked by a first masking structure 270 and a second masking structure 271. In this embodiment, the unmasked region 233 includes a body region of a transistor, however one skilled in the art will recognize that other semiconductor device structures may utilize this process. Also located within the deposition chamber 260 is an electron gun 263, a second electron gun 265, a target 261, and a second target 262. The first electron gun 263 provides an electron beam 264 directed at target 261 containing dry pellets of $Al_2O_3$. The second electron gun 265 provides an electron beam 266 directed at target 262 containing dry pellets of $La_2O_3$. The electron guns individually include a rate monitor for controlling the rate of evaporation of the material in the target at which each individual beam is directed. Evaporating the dry pellets of $Al_2O_3$ and $La_2O_3$ is individually controlled using the rate monitors of electron gun 263 and electron gun 265 to form a layer 240 having a composition containing $LaAlO_3$ having a predetermined dielectric constant. For convenience, control displays and necessary electrical connections as are known to those skilled in the art are not shown in FIG. 2. Alternatively, one target containing dry pellets of $Al_2O_3$ and $La_2O_3$ could be used with one electron gun. However, in such an arrangement, the individual evaporation of $Al_2O_3$ and $La_2O_3$ could not be controlled, not allowing for forming a film composition with a predetermined dielectric constant. Although in one embodiment, an electron beam evaporation technique is used, it will be apparent to one skilled in the art that other thermal evaporation techniques can be used without departing from the scope of the invention.

During the evaporation process, the electron guns 263, 265 generate electron beams 264, 266. Beginning the evaporation process using electron gun 265 is performed substantially concurrent with beginning the evaporation process using electron gun 265. The electron beam 264 hits target 261 containing dry pellets of $Al_2O_3$, and heats a portion of target 261 enough to cause the dry pellets of $Al_2O_3$ on the surface of the target 261 to evaporate. The evaporated material 268 is then distributed throughout the chamber 260. The electron beam 266 hits target 262 containing dry pellets of $La_2O_3$, and heats a portion of target 262 enough to cause the dry pellets of $La_2O_3$ the surface of the target 262 to evaporate. The evaporated material 269 is then distributed throughout the chamber 260. Evaporate material 268 and evaporate material 269 are intermingled throughout the chamber forming a film 240 containing $LaAlO_3$ on the surface of the exposed body region 233 that it contacts.

The evaporation process can be performed in chamber 260 using a base pressure lower than about $5\times10^{-7}$ Torr and a deposition pressure less than about $2\times10^{-6}$ Torr. Performing the evaporation under these conditions should allow a growth rate in the range from about 0.5 to about 50 nm/min. After deposition, the wafer or substrate 210 containing the film is annealed ex situ in an electric furnace at about 700° C. for about 10 minutes in $N_2$ ambience. Alternately, the wafer or substrate 210 can be annealed by RTA for about 10 to about 15 seconds in $N_2$ ambience.

The $LaAlO_3$ dielectric film should have a dielectric constant in the range of about 21 to about 25. However, by controlling the evaporation rates of the first electron gun 263 and the second electron gun 265, the composition of the film can vary from be a film of essentially $Al_2O_3$ to a film that is essentially $La_2O_3$. Correspondingly, the dielectric constant of the formed film will range from about 9 to about 30, with a dielectric constant in the range of about 21 to about 25 corresponding to a layer that is essentially $LaAlO_3$. Thus, choosing a predetermined dielectric constant in the range of about 9 to about 30, the two electron guns will be controlled to formed a film containing $Al_2O_3$, $La_2O_3$, and $LaAlO_3$ in varying amounts depending on the setting for controlling the evaporation rates.

A range of equivalent oxide thickness, $t_{eq}$, attainable in accordance with the present invention is associated with the capability to provide a composition having a dielectric constant in the range form about 9 to about 30, and the capability to attain growth rates in the range of from about 0.5 to about 50 nm/min. The $t_{eq}$ range in accordance with the present invention are shown in the following

| κ | Physical Thickness t = 0.5 nm (5 Å) $t_{eq}$ (Å) | Physical Thickness t = 1.0 nm (10 Å) $t_{eq}$ (Å) | Physical Thickness t = 50 nm (500 Å) $t_{eq}$ (Å) |
|---|---|---|---|
| 9 | 2.17 | 4.33 | 216.67 |
| 21 | .93 | 1.86 | 92.86 |
| 25 | .78 | 1.56 | 78 |
| 30 | .65 | 1.3 | 65 |

$LaAlO_3$ in a bulk form at room temperature has a nearly cubic perovskite crystal structure with a lattice constant of 0.536 nm. Fortunately, the films grown by electron gun evaporation have an amorphous form, though it is expected that a dimension for a monolayer of $LaAlO_3$ is related to its lattice constant in bulk form. At a physical thickness about 0.5 nm, $t_{eq}$ would be expected to range from about 2.2 Å to about 0.65 Å for the dielectric constant ranging from 9 to 30. For a layer of essentially $LaAlO_3$, $t_{eq}$ would be expected to range from about 0.93 Å to about 0.78 Å for a physical layer of 0.5 nm. The lower limit on the scaling of a layer containing $LaAlO_3$ would depend on the monolayers of the film necessary to develop a full band gap such that good insulation is maintained between an underlying silicon layer and an overlying conductive layer to the $LaAlO_3$ film. This requirement is necessary to avoid possible short circuit effects between the underlying silicon layer and the overlying conductive layer. For a substantially $LaAlO_3$ film having a thickness of approximately 2 nm, $t_{eq}$ would range from about 3 Å to about 3.7 Å. From above, it is apparent that a film containing $LaAlO_3$ can be attained with a $t_{eq}$ ranging from 1.5 Å to 5 Å. Further, such a film can provide a $t_{eq}$ significantly less than 2 or 3 Å, even less than 1.5 Å.

The novel process described above provides significant advantages by evaporating dry pellets of $Al_2O_3$ and $La_2O_3$. Dry pellets of $Al_2O_3$ and $La_2O_3$ expensive than single crystal pellets of $LaAlO_3$. Further, using two electron guns allows the formation of a gate dielectric with a chosen dielectric constant. Additionally, the novel process can be implemented to form transistors, memory devices, and information handling devices.

A transistor 100 as depicted in FIG. 1 can be formed by forming a source/drain region 120 and another source/drain region 130 in a silicon based substrate 110 where the two source/drain regions 120, 130 are separated by a body region 132. The body region 132 separated by the source/drain 120 and the source/drain 130 defines a channel having a channel length 134. $Al_2O_3$ is evaporated using an electron gun at a controlled rate. $La_2O_3$ is evaporated using a second electron gun at a second controlled rate. Evaporating the $Al_2O_3$ source is begun substantially concurrent with evaporating $La_2O_3$, forming a film 140 containing $LaAlO_3$ on the body region. A gate is formed over the gate dielectric 140. Typically, forming the gate includes forming a polysilicon layer, though a metal gate can be formed in an alternative process. Forming the substrate, source/region regions, and the gate is performed using standard processes known to those skilled in the art. Additionally, the sequencing of the various elements of the process for forming a transistor is conducted with standard fabrication processes, also as known to those skilled in the art.

Figure 3:
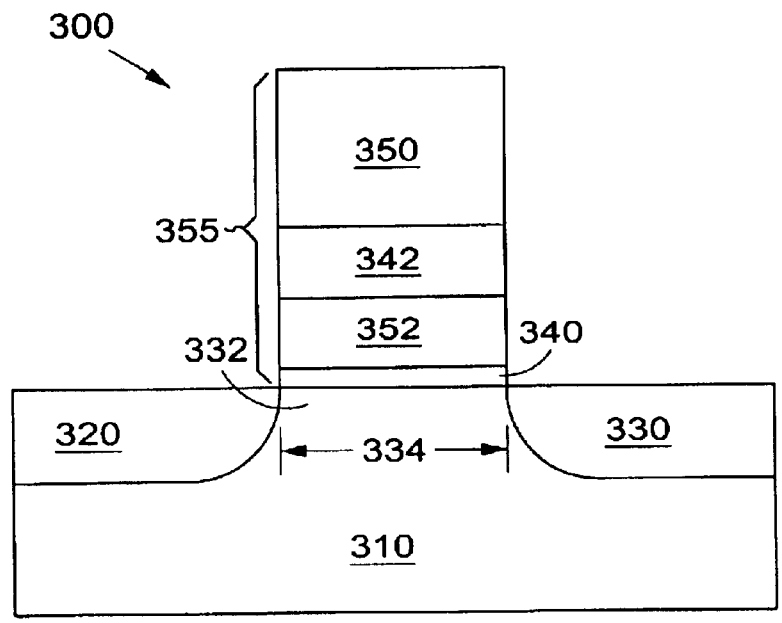
FIG. 3 depicts another configuration of a transistor capable of being fabricated in accordance with the present invention.

The method of evaporating $LaAlO_3$ films for a gate dielectric in accordance with the present invention can be applied to other transistor structures having dielectric layers. For example, the structure of FIG. 3 depicts a transistor 300 having a silicon based substrate 310 with two source/drain regions 320, 330 separated by a body region 332. The body region 332 between the two source/drain regions 320, 330 defines a channel region having a channel length 334. Located above the body region 332 is a stack 355 including a gate dielectric 340, a floating gate 352, a floating gate dielectric 342, and control gate 350. The gate dielectric 340 can be formed as described above with the remaining elements of the transistor 300 formed using processes known to those skilled in the art. Alternately, both the gate dielectric 340 and the floating gate dielectric 342 can be formed in accordance with the present invention as described above.

Figure 5:
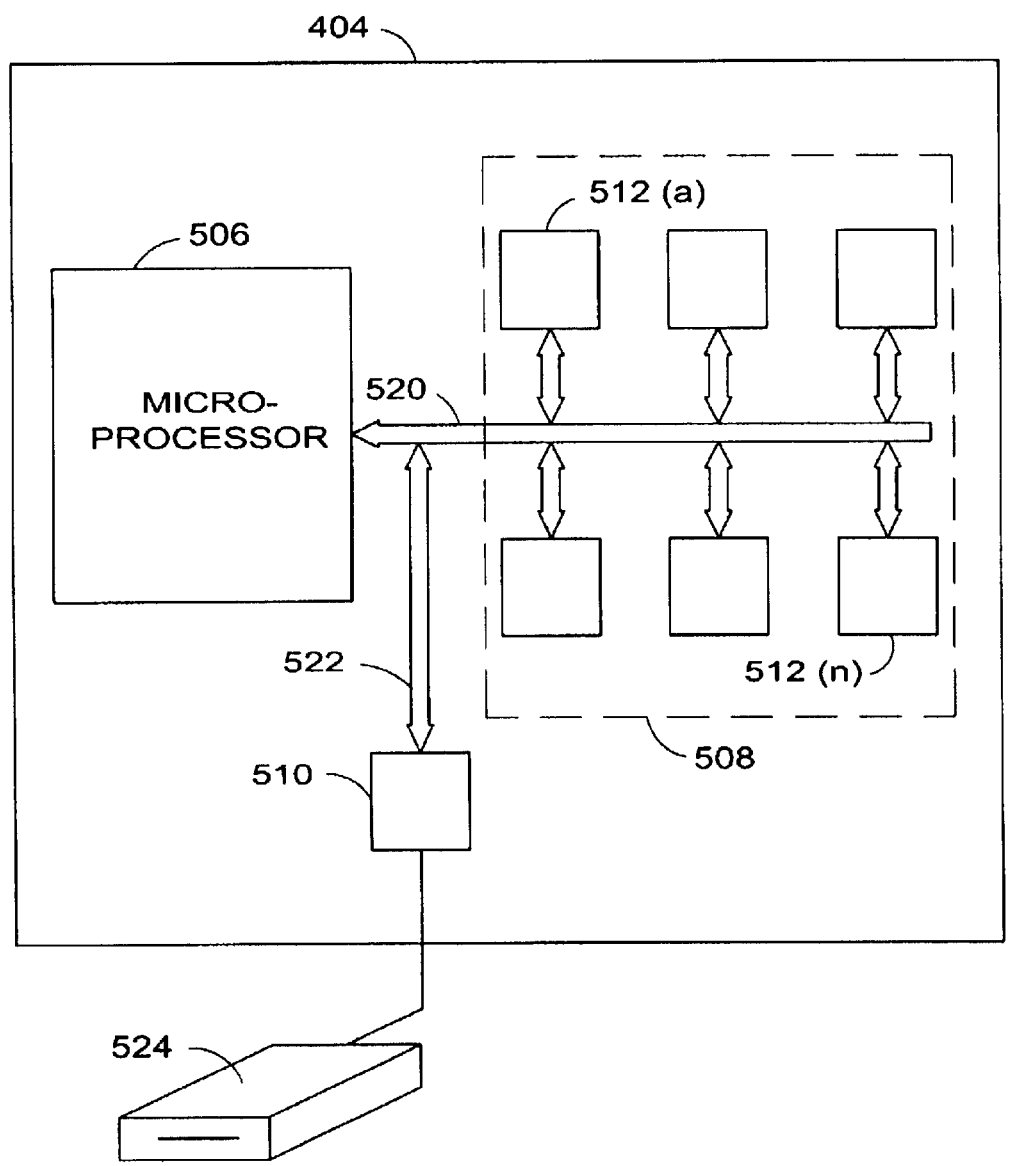
FIG. 5 depicts a schematic view of a central processing unit incorporating devices made in accordance with the present invention.
Figure 6:
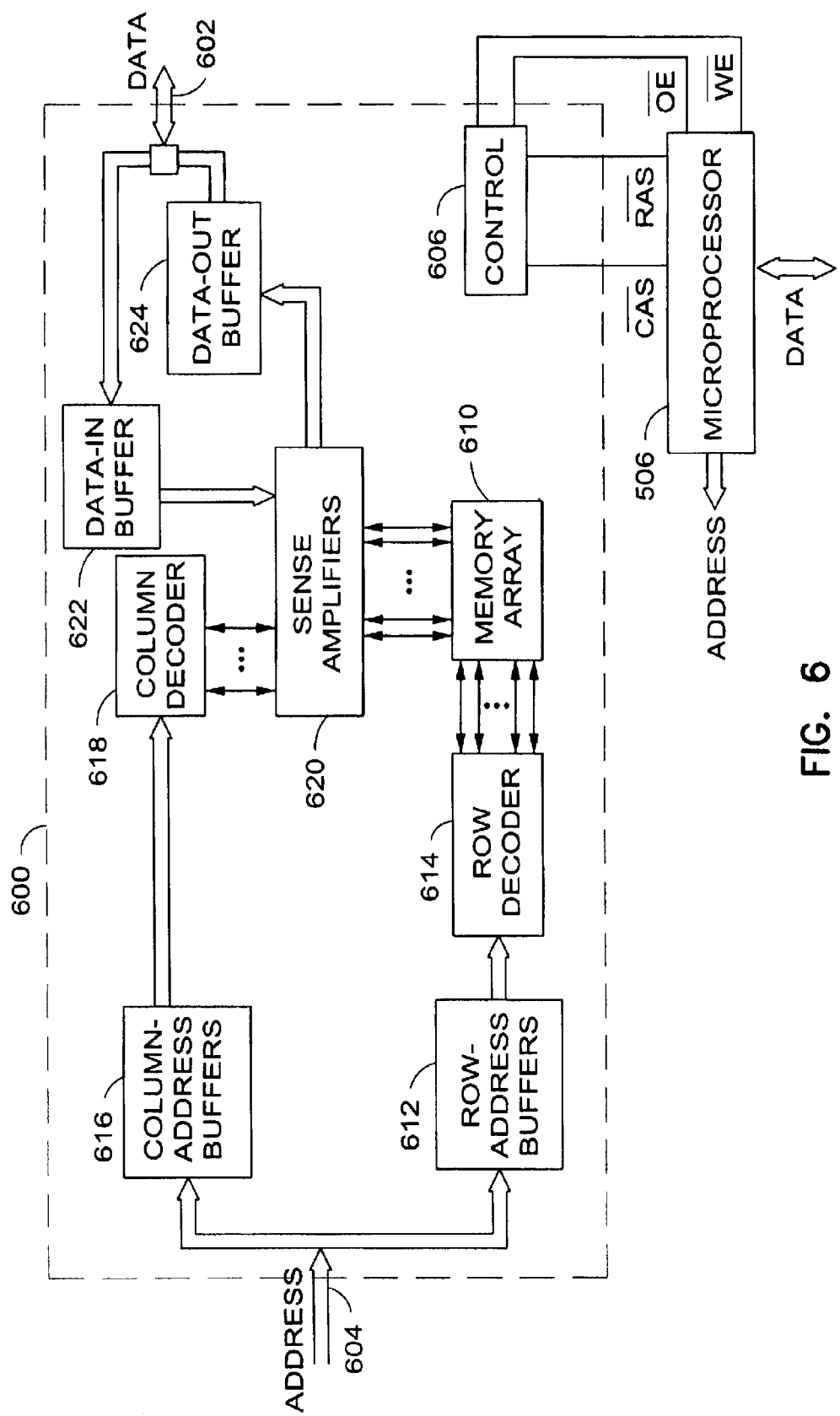
FIG. 6 shows a schematic view of a DRAM memory device in accordance with the present invention.

Transistors created by the methods described above may be implemented into memory devices and information handling devices as shown in FIGS. 5–7 and described below. While specific types of memory devices and computing devices are shown below, it will be recognized by one skilled in the art that several types of memory devices and information handling devices could utilize the invention.

Figure 4:
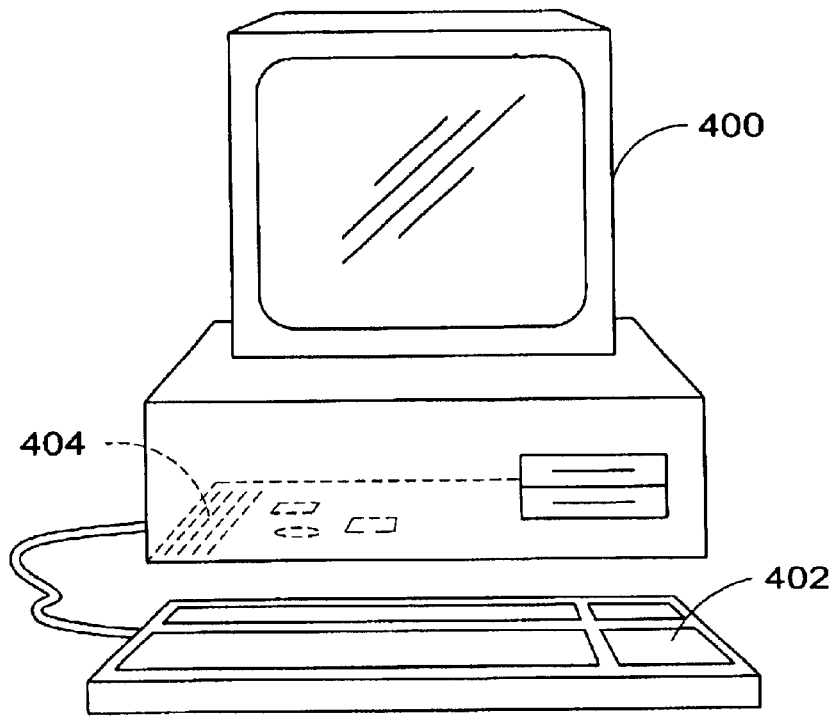
FIG. 4 depicts a perspective view of a personal computer incorporating devices made in accordance with the present invention.

A personal computer, as shown in FIGS. 4 and 5, include a monitor 400, keyboard input 402 and a central processing unit 404. The processor unit typically includes microprocessor 506, memory bus circuit 508 having a plurality of memory slots 512($a$–$n$), and other peripheral circuitry 510. Peripheral circuitry 510 permits various peripheral devices 524 to interface processor-memory bus 520 over input/output (I/O) bus 522. The personal computer shown in FIGS. 4 and 5 also includes at least one transistor having a gate dielectric according to the teachings of the present invention.

Microprocessor 506 produces control and address signals to control the exchange of data between memory bus circuit 508 and microprocessor 506 and between memory bus circuit 508 and peripheral circuitry 510. This exchange of data is accomplished over high speed memory bus 520 and over high speed I/O bus 522.

Coupled to memory bus 520 are a plurality of memory slots 512($a$–$n$) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 512. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 508. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 520. Other alternative types of devices include SDRAM, DDR SDRAM, SLDRAM and Direct RDRAM as well as others such as SRAM or Flash memories.

FIG. 6 is a block diagram of an illustrative DRAM device 600 compatible with memory slots 512($a$–$n$). The description of DRAM 600 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 6 includes at least one transistor having a gate dielectric according to the teachings of the present invention.

Control, address and data information provided over memory bus 520 is further represented by individual inputs to DRAM 600, as shown in FIG. 6. These individual representations are illustrated by data lines 602, address lines 604 and various discrete lines directed to control logic 606.

As is well known in the art, DRAM 600 includes memory array 610 which in turn comprises rows and columns of addressable memory cells. Each memory cell in a row is coupled to a common wordline. The wordline is coupled to gates of individual transistors, where at least one transistor has a gate coupled to a gate dielectric containing $LaAlO_3$ in accordance with the method and structure previously described above. Additionally, each memory cell in a column is coupled to a common bitline. Each cell in memory array 610 includes a storage capacitor and an access transistor as is conventional in the art.

DRAM 600 interfaces with, for example, microprocessor 606 through address lines 604 and data lines 602. Alternatively, DRAM 600 may interface with a DRAM controller, a micro-controller, a chip set or other electronic system. Microprocessor 506 also provides a number of control signals to DRAM 600, including but not limited to, row and column address strobe signals RAS and CAS, write enable signal WE, an output enable signal OE and other conventional control signals.

Row address buffer 612 and row decoder 614 receive and decode row addresses from row address signals provided on address lines 604 by microprocessor 506. Each unique row address corresponds to a row of cells in memory array 610. Row decoder 614 includes a wordline driver, an address decoder tree, and circuitry which translates a given row address received from row address buffers 612 and selectively activates the appropriate wordline of memory array 610 via the wordline drivers.

Column address buffer 616 and column decoder 618 receive and decode column address signals provided on address lines 604. Column decoder 618 also determines when a column is defective and the address of a replacement column. Column decoder 618 is coupled to sense amplifiers 620. Sense amplifiers 620 are coupled to complementary pairs of bitlines of memory array 610.

Sense amplifiers 620 are coupled to data-in buffer 622 and data-out buffer 624. Data-in buffers 622 and data-out buffers 624 are coupled to data lines 602. During a write operation, data lines 602 provide data to data-in buffer 622. Sense amplifier 620 receives data from data-in buffer 622 and stores the data in memory array 610 as a charge on a capacitor of a cell at an address specified on address lines 604.

During a read operation, DRAM 600 transfers data to microprocessor 506 from memory array 610. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 620 detects and amplifies a difference in voltage between the complementary bitlines. The sense amplifier passes the amplified voltage to data-out buffer 624.

Control logic 606 is used to control the many available functions of DRAM 600. In addition, various control circuits and signals not detailed herein initiate and synchronize DRAM 600 operation as known to those skilled in the art. As stated above, the description of DRAM 600 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Conclusion

A gate dielectric containing $LaAlO_3$ and method of fabricating a gate dielectric contained $LaAlO_3$ are provided that produces a reliable gate dielectric having a thinner equivalent oxide thickness than attainable using $SiO_2$. $LaAlO_3$ gate dielectrics formed using the methods described herein are thermodynamically stable such that the gate dielectrics formed will have minimal reactions with a silicon substrate or other structures during processing.

Transistors and higher level ICs or devices are provided utilizing the novel gate dielectric and process of formation. Gate dielectric layers containing $LaAlO_3$ are formed having a high dielectric constant ($\kappa$) capable of a $t_{eq}$ thinner than 5 Å, thinner than the expected limit for $SiO_2$ gate dielectrics. At the same time, the physical thickness of the $LaAlO_3$ layer is much larger than the $SiO_2$ thickness associated with the $t_{eq}$ limit of $SiO_2$. Forming the larger thickness provides advantages in processing the gate dielectric. In addition forming a dielectric containing $LaAlO_3$, $Al_2O_3$, and $La_2O_3$ through controlling the evaporation of $Al_2O_3$ and $La_2O_3$ sources allows the selection of a dielectric constant ranging from that of $Al_2O_3$ to the dielectric constant of $La_2O_3$.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a gate dielectric on a transistor body region, comprising:
   evaporating $Al_2O_3$ at a first rate;
   evaporating $La_2O_3$ at a second rate; and
   controlling the first rate and the second rate to provide a film containing $LaAlO_3$ on the transistor body region.

2. The method of claim 1, wherein evaporating $Al_2O_3$ and evaporating $La_2O_3$ includes evaporating dry pellets of $Al_2O_3$ and $La_2O_3$.

3. The method of claim 1, wherein evaporating $La_2O_3$ includes evaporating $La_2O_3$ by electron beam evaporation.

4. The method of claim 1, wherein controlling the first rate and the second rate includes controlling the first rate and the second rate to selectively provide a film composition having a predetermined dielectric constant.

5. The method of claim 4, wherein selectively providing a film composition having a predetermined dielectric constant includes providing a film composition with a dielectric constant ranging from the dielectric constant of an $Al_2O_3$ film to the dielectric constant of a $La_2O_3$, film.

6. The method of claim 1, wherein controlling the first rate and the second rate to provide a film containing $LaAlO_3$ includes providing an amorphous $LaAl_3$ film.

7. The method of claim 1, wherein evaporating $La_2O_3$ begins substantially concurrent with beginning evaporating $Al_2O_3$.

8. The method of claim 1, wherein evaporating $Al_2O_3$ and evaporating $La_2O_3$ includes depositing $LaAlO_3$ on the transistor body region in a base pressure lower than about $5 \times 10^{-7}$ Torr and in a deposition pressure lower than about $2 \times 10^{-6}$ Torr.

9. The method of claim 1, further including annealing the transistor body region after providing the film containing $LaAlO_3$.

10. The method of claim 9, wherein annealing the transistor body region after providing the film containing $LaAlO_3$ includes annealing in $N_2$.

11. The method of claim 10, wherein annealing in $N_2$ includes annealing in an electric furnace at about 700° C.

12. The method of claim 10, wherein annealing in $N_2$ includes annealing in RTA in the range from about 800° C. to about 900° C.

13. A method of forming a gate dielectric on a transistor body region, comprising:
   evaporating $Al_2O_3$ at a first rate using a first electron gun;
   evaporating $La_2O_3$ at a second rate using a second electron gun, and controlling the first rare and the second rate to provide a film containing LaAlO₃ on the transistor body region.

14. The method of claim 13, wherein evaporating $Al_2O_3$ and evaporating $La_2O_3$ includes evaporating dry pellets of $Al_2O_3$ and $La_2O_3$.

15. The method of claim 13, wherein controlling the first rate and the second rate includes controlling the first rate and the second rate to selectively provide a film composition having a predetermined dielectric constant.

16. The method of claim 15, wherein selectively providing a film composition having a predetermined dielectric constant includes providing a film composition with a dielectric constant ranging from the dielectric constant of an $Al_2O_3$ film to the dielectric constant of a $La_2O_3$ film.

17. The method of claim 13, wherein controlling the first rate and the second rate to provide a film containing $LaAlO_3$ includes providing an amorphous $LaAlO_3$ film.

18. The method of claim 13, wherein evaporating $La_2O_3$ begins substantially concurrent with beginning evaporating $Al_2O_3$.

19. The method of claim 13, wherein forming the gate dielectric includes growing the film containing $LaAlO_3$ at a growth rate in the range from about 0.5 nm/mm to about 50 nm/mm.

20. The method of claim 13, further including annealing the transistor body region after providing the film containing $LaAlO_3$.

21. A method of forming a gate dielectric on a transistor body region, comprising:
 evaporating $Al_2O_3$ at a first rate using a first electron gun;
 evaporating $La_2O_3$ at a second rate using a second electron gun;
 controlling the first rate and the second rate to provide a film containing $LaAlO_3$ on the transistor body region; and
 annealing in $N_2$ after providing the film containing $LaAlO_3$ on the transistor body region.

22. The method of claim 21, wherein evaporating $Al_2O_3$ and evaporating $La_2O_3$ includes evaporating dry pellets of $Al_2O_3$ and $La_2O_3$.

23. The method of claim 21, wherein controlling the first rate and the second rate includes controlling the first rate and the second rare to selectively provide a film composition having a predetermined dielectric constant.

24. The method of claim 21, wherein controlling the first rate and the second rate to provide a film containing $LaAlO_3$ includes providing an amorphous $LaAlO_3$ film.

25. The method of claim 21, wherein evaporating $La_2O_3$ begins substantially concurrent with beginning evaporating $Al_2O_3$.

26. The method of claim 21, wherein evaporating $Al_2O_3$ and evaporating $La_2O_3$ includes depositing $LaAlO_3$ on the transistor body region in a base pressure lower than about $5 \times 10^{-7}$ Torr and in a deposition pressure lower than about $2 \times 10^{-4}$ Torr.

27. The method of claim 21, wherein annealing in $N_2$ includes annealing in an electric furnace at about 700° C.

28. The method of claim 21, wherein forming the gate dielectric includes growing the film containing $LaAlO_3$ at a growth rate in the range from about 0.5 nm/min to about 50 nm/mm.

29. A method of forming a transistor, comprising:
 forming first and second source/drain regions;
 forming a body region between the first and second source/drain regions;
 evaporating $Al_2O_3$ at a first rate;
 evaporating $La_2O_3$ at a second rate;
 controlling the first rate and the second rate to provide a film containing $LaAlO_3$ on the body region; and
 coupling a gate to the film containing $LaAlO_3$.

30. The method of claim 29, wherein evaporating $Al_2O_3$ and evaporating $La_2O_3$ includes evaporating dry pellets of $Al_2O_3$ and $La_2O_3$.

31. The method of claim 29, wherein controlling the first rate and the second rate includes controlling the first rate and the second rate to selectively provide a film composition having a predetermined dielectric constant.

32. The method of claim 29, wherein selectively providing a film composition having a predetermined dielectric constant includes providing a film composition with a dielectric constant ranging from the dielectric constant of an $Al_2O_3$ film to the dielectric constant or a $La_2O_3$ film.

33. The method of claim 29, wherein controlling the first rate and the second rate to provide a film containing $LaAlO_3$ includes providing an amorphous $LaAlO_3$ film.

34. The method of claim 29, wherein evaporating $La_2O_3$ begins substantially concurrent with beginning evaporating $Al_2O_3$.

35. A method of forming a memory array, comprising:
 forming a number of access transistors, comprising:
  forming first and second source/drain regions;
  forming a body region between the first and second source/drain regions;
  evaporating $Al_2O_3$ at a first rate;
  evaporating $La_2O_3$ at a second rate;
  controlling the first rate and the second rate to provide a film containing $LaAlO_3$ on the body region; and
  coupling a gate to the film containing $LaAlO_3$;
 forming a number of wordlines coupled to a number of the gates of the number of access transistors;
 forming a number of sourcelines coupled to a number of the first source/drain regions of the number of access transistors; and
 forming a number of bitlines coupled to a number of the second source/drain regions of the number of access transistors.

36. The method of claim 35, wherein evaporating $Al_2O_3$ and evaporating $La_2O_3$ includes evaporating dry pellets of $Al_2O_3$ and $La_2O_3$.

37. The method of claim 35, wherein controlling the first rate and the second rate includes controlling the first rate and the second rate to selectively provide a film composition having a predetermined dielectric constant.

38. The method of claim 37, wherein selectively providing a film composition having a predetermined dielectric constant includes providing a film composition with a dielectric constant ranging from the dielectric constant of an $Al_2O_3$ film to the dielectric constant of a $La_2O_3$ film.

39. The method of claim 35, wherein forming the gate dielectric includes growing the film containing $LaAlO_3$ at a growth rate in the range from about 0.5 nm/mm to about 50 nm/mm.

40. A method of forming an information handling system, comprising:
 forming a processor;
 forming a memory array, comprising:
  forming a number of access transistors, comprising:
   forming first and second source/drain regions;
   forming a body region between the first and second source/drain regions;

evaporating $Al_2O_3$ at a first rate;
evaporating $La_2O_3$ at a second rate;
controlling the first rate and the second rate to provide a film containing $LaAlO_3$ on the body region; and
coupling a gate to the film containing $LaAlO_3$;
forming a number of wordlines coupled to a number of the gates of the number of access transistors;
forming a number of sourcelines coupled to a number of the first source/drain regions of the number of access transistors;
forming a number of bitlines coupled to a number of the second source/drain regions of the number of access transistors; and
forming a system bus that couples the processor to the memory array.

41. The method of claim 40, wherein evaporating $Al_2O_3$ and evaporating $La_2O_3$ includes evaporating dry pellets of $Al_2O_3$ and $La_2O_3$.

42. The method of claim 40, wherein evaporating $La_2O_3$ and evaporating $Al_2O_3$ includes evaporating $La_2O_3$ and evaporating $Al_2O_3$ by electron beam evaporation.

43. The method of claim 40, wherein controlling the first rate and the second rate includes controlling the first rate and the second rate to selectively provide a film composition having a predetermined dielectric constant.

\* \* \* \* \*

UNITED STATES PATENT AND TRADEMARK OFFICE
CERTIFICATE OF CORRECTION

| | | |
|---|---|---|
| PATENT NO. | : 6,893,984 B2 | |
| APPLICATION NO. | : 10/081439 | |
| DATED | : May 17, 2005 | |
| INVENTOR(S) | : Ahn et al. | |

It is certified that error appears in the above-identified patent and that said Letters Patent is hereby corrected as shown below:

On the face page, in field (54), in "Title", in column 1, line 1, delete "LAAlO$_3$" and insert - - LAALO$_3$ - -, therefor.

On the face page, in field (75), under "Inventors", in column 1, line 1, delete "Kiey" and insert - - Kie - -, therefor.

On the face page, in field (56), under "U.S. Patent Documents", in column 1, line 1, insert - - 4,058,430  11/1977  Suntola et al.  427/255.13 - - above "4,394,673 A  7/1983  Thompson et al.   357/15".

On the face page, in field (56), under "U.S. Patent Documents", in column 1, line 1, below "4,394,673 A  7/1983  Thompson et al.   357/15" insert - - 4,725,877  02/1988  Brasen et al. 257/751 - -.

On the face page, in field (56), under "Other Publications", in column 2, line 5, delete "LaAlO$_3$" and insert - - LaAlO$_3$ - -, therefor.

On the face page, in field (56), under "Other Publications", in column 2, line 9, delete "LaAlO$_3$" and insert - - LaAlO$_3$ - -, therefor.

On the face page, in field (56), under "Other Publications", in column 2, line 11, delete "LaAlO$_3$" and insert - - LaAlO$_3$ - -, therefor.

On the face page, in field (56), under "Other Publications", in column 2, line 12, delete "LaAlO$_3$" and insert - - LaAlO$_3$ - -, therefor.

On page 2, in field (56), under "U.S. Patent Documents", in column 1, line 22, below "6,534,420 B2  3/2003  Ahn et al. 438/768" insert - - 6,537,613  3/2003  Senzaki et al. 427,250 - -.

On page 2, in field (56), under "U.S. Patent Documents", in column 1, line 24, below "6,627,503 B2  9/2003  Ma et al. 438/287" insert - - 6,639,267  10/2003  Eldridge, Jerome M.  257/310 - -.

UNITED STATES PATENT AND TRADEMARK OFFICE
CERTIFICATE OF CORRECTION

| | |
|---|---|
| PATENT NO. | : 6,893,984 B2 |
| APPLICATION NO. | : 10/081439 |
| DATED | : May 17, 2005 |
| INVENTOR(S) | : Ahn et al. |

It is certified that error appears in the above-identified patent and that said Letters Patent is hereby corrected as shown below:

On page 2, in field (56), under "U.S. Patent Documents", in column 1, line 25, below "6,645,882 B1* 11/2003 Halliyal et al. 438/785" insert - - 6,660,660 12/2003 Haukka et al. 438/778 - -.

On page 2, in field (56), under "U.S. Patent Documents", in column 1, line 28, delete "438/258" and insert - - 438/238 - -, therefor.

On page 2, in field (56), under "U.S. Patent Documents", in column 1, line 28, below "6,699,745 B1 3/2004 Banerjee et al. 438/258" insert - - 6,713,846 03/2004 Senzaki 257/635 - -.

On page 2, in field (56), under "U.S. Patent Documents", in column 1, line 29, above "2002/0089023 A1 7/2002 Yu et al. 257/411" insert - - 6,730,575 05/2004 Eldridge, Jerome M. 257/310 - -.

On page 2, in field (56), under "U.S. Patent Documents", in column 1, line 29, below "2002/0089023 A1 7/2002 Yu et al. 257/411" insert - - 2002/0111001 08/2002 Ahn et al. 438/592 - -.

On page 2, in field (56), under "U.S. Patent Documents", in column 2, line 5, below "2003/0207593 A1 11/2003 Derderian et al. 438/778" insert - - 2004/0033701 A1 02/2004 Ahn et al. 438/785 - -.

On page 2, in field (56), under "Other Publications", in column 2, line 2, delete "LaAlO$_3$" and insert - - LaAlO$_3$ - -, therefor.

On page 2, in field (56), under "Other Publications", in column 2, line 14, Delete "Bunshad" and insert - - BUNSHAH - -, therefor.

On page 2, in field (56), under "Other Publications", in column 2, line 21, after "Era" insert - - , - -.

UNITED STATES PATENT AND TRADEMARK OFFICE
CERTIFICATE OF CORRECTION

PATENT NO. : 6,893,984 B2
APPLICATION NO. : 10/081439
DATED : May 17, 2005
INVENTOR(S) : Ahn et al.

It is certified that error appears in the above-identified patent and that said Letters Patent is hereby corrected as shown below:

On page 2, in field (56), under "Other Publications", in column 2, line 22, delete "Lattic" and insert -- Lattice --, therefor.

In column 1, line 1, delete "LAAlO$_3$" and insert -- LAALO$_3$ --, therefor.

In column 2, line 32, delete "(8.9 cV)" and insert -- (8.9 eV) --, therefor.

In column 6, line 41, delete "cm$^2$" and insert -- cm$^{-2}$ --, therefor.

In column 8, line 66, after "La$_2$O$_3$" insert -- are less --.

In column 12, line 40, in Claim 5, after "La$_2$O$_3$" delete ",".

In column 12, line 43, in Claim 6, delete "LaAl$_3$" and insert -- LaAlO$_3$ --, therefor.

In column 12, line 67, in Claim 13, after "gun" delete "," and insert -- ; --, therefor.

In column 13, line 1, in Claim 13, delete "rare" and insert -- rate --, therefor.

UNITED STATES PATENT AND TRADEMARK OFFICE
CERTIFICATE OF CORRECTION

PATENT NO. : 6,893,984 B2
APPLICATION NO. : 10/081439
DATED : May 17, 2005
INVENTOR(S) : Ahn et al.

It is certified that error appears in the above-identified patent and that said Letters Patent is hereby corrected as shown below:

In column 13, line 23, in Claim19, delete "nm/mm" and insert - - nm/min - -, therefor.

In column 13, line 24, in Claim19, delete "nm/mm" and insert - - nm/min - -, therefor.

In column 13, line 44, in Claim 23, delete "rare" and insert - - rate - -, therefor.

In column 13, line 56, in Claim 26, delete "$2 \times 10^{-4}$" and insert - - $2 \times 10^{-6}$ - -, therefor.

In column 13, line 62, in Claim 28, delete "nm/mm" and insert - - nm/min - -, therefor.

In column 14, line 17, in Claim 32, delete "or" and insert - - of - -, therefor.

In column 14, line 58, in Claim 39, delete "nm/mm" and insert - - nm/min - -, therefor.

In column 14, line 59, in Claim 39, delete "nm/mm" and insert - - nm/min - -, therefor.

Signed and Sealed this

Twelfth Day of September, 2006

JON W. DUDAS
*Director of the United States Patent and Trademark Office*